(12) United States Patent
Wu et al.

(10) Patent No.: US 6,826,736 B2
(45) Date of Patent: Nov. 30, 2004

(54) SHAPE BASED NOISE TOLERANCE CHARACTERIZATION AND ANALYSIS OF LSI

(75) Inventors: Lifeng Wu, Fremont, CA (US); Jianlin Wei, San Jose, CA (US); I-Hsien Chen, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/340,221

(22) Filed: Jan. 10, 2003

(65) Prior Publication Data

US 2004/0015339 A1 Jan. 22, 2004

Related U.S. Application Data (60) Provisional application No. 60/387,294, filed on Jun. 7, 2002, and provisional application No. 60/387,272, filed on Jun. 7, 2002.

(51) Int. Cl.[7] .................................................. G06F 9/45
(52) U.S. Cl. ...................... 716/5; 716/4; 716/6; 703/5; 703/14
(58) Field of Search ............................ 716/4–6; 703/5, 703/14

(56) References Cited

U.S. PATENT DOCUMENTS

| 5,198,986 | A | 3/1993 | Ikeda et al. |
|---|---|---|---|
| 5,243,547 | A | 9/1993 | Tsai et al. |
| 5,446,674 | A | 8/1995 | Ikeda et al. |
| 5,481,695 | A | 1/1996 | Purks |
| 5,535,133 | A | 7/1996 | Petschauer et al. |
| 5,568,395 | A | 10/1996 | Huang |
| 5,596,506 | A | 1/1997 | Petschauer et al. |
| 6,028,989 | A | 2/2000 | Dansky et al. |
| 6,279,142 | B1 | 8/2001 | Bowen et al. |
| 6,493,853 | B1 * | 12/2002 | Savithri et al. ................ 716/5 |

OTHER PUBLICATIONS

Copy of International Search Report mailed Jul. 24, 2003.
Liu et al., "The Combined Effects of Internal Noise and Electromagnetic Interference in CMOS VLSI Circuits," *Sixth International Conference on Electromagnetic Compatibility*, 1988, pp. 303–322.
Shepard et al., "Cell Characterization for Noise Stability," *IEEE 2000 Custom Integrated Circuits Conference*, pp. 91–94.

(List continued on next page.)

*Primary Examiner*—Donghee Kang
(74) *Attorney, Agent, or Firm*—Parsons Hsue & de Runtz LLP (57) ABSTRACT

The present invention presents techniques for considering whether the effects of cross-talk coupling and other noise exceed the noise tolerance of a circuit. One aspect of the present invention uses a set of parameters to represent this noise. An exemplary embodiment uses a triangle or trapezoidal approximation to a glitch based on a set of parameters: the peak voltage value, the width, the leading edge slope and the trailing edge slope. These values are then used as the input of a library to look up the corresponding noise tolerance parameter set values. In a variation, a set of formulae can provide the noise tolerance parameter set values. In an exemplary embodiment, the noise tolerance parameter set is taken to include the minimum peak value for the noise to be possibly harmful and the minimum width value for the noise to be possibly harmful.

48 Claims, 5 Drawing Sheets

OTHER PUBLICATIONS

Sato et al., "Accurate Measurement of Peak Noise and Delay Change Induced by Interconnect Coupling," *IEEE Journal of Solid–State Circuits,* vol. 36, No. 10, Oct. 2001, pp. 1587–1591.

Ilumoka, "Efficient ANN–Based Interconnect Delay and Crosstalk Modeling," *Proc. 22$^{nd}$ International Conference on Microelectronics (Miel 2000)*, vol. 2, Nis, Servia, May 14–17, 2000, pp. 727–730.

Lee et al., "Generalized Interconnect Delay Time and Crosstalk Models: I. Application of Interconnect Optimization Design," *Jpn. J. Appl. Phys.,* vol. 40 (2001) pp. 6686–6693.

Lee et al., "Generalized Interconnect Delay Time and Crosstalk Models: II. Crosstalk–Induced Delay Time Deterioration and Worst Crosstalk Models," *Jpn. J. Appl. Phys.,* vol. 40 (2001), pp. 6694–6699.

Kahng et al., "Noise and Delay Uncertainty Studies for Coupled RC Interconnects," *Twelfth Annual IEEE International ASIC/SOC Conference,* 1999, p. 3–8.

Chen et al., "Test Generation for Crosstalk–Induced Faults: Framework and Computational Results," *Journal of Electronic Testing: Theory and Applications,* 18, 2002, pp. 17–28.

\* cited by examiner

SHAPE BASED NOISE TOLERANCE CHARACTERIZATION AND ANALYSIS OF LSI

The present application claims priority from U.S. provisional patent application Ser. No. 60/387,294, filed Jun. 7, 2002, and is related to a concurrently filed U.S. patent application entitled "Shape Based Noise Characterization and Analysis of LSI" which claims priority from U.S. provisional patent application Ser. No. 60/387,272, filed Jun. 7, 2002, all of which are hereby incorporated by reference.

BACKGROUND OF THE INVENTION

This invention pertains to the field of simulating the operation of integrated circuits, and has application to the inclusion of noise effects into such simulations.

In the modeling and simulation of integrated circuits, many effects need to be considered. Some of these effects can be neglected in some circumstances, but begin to introduce non-negligible effects in other circumstances. Similarly, models and techniques that are effective in one regime begin to become unreliable when pushed into other regimes. One set of effects that can influence the operation of a circuit is noise, both from within the various cells that make up the circuit and arising in the connections between these cells.

One particular source of noise in large scale integrated (LSI) circuits is coupling noise between independent networks. This is illustrated schematically in FIG. 1, where a signal in one network, the "victim" network B, 105 is affected by an adjacent network A, the "aggressor" network, 103 through a coupling capacitance $C_C$ 101. For this discussion, network A 103 is shown to only have one instance of a cell and receives a rising waveform 110 going from a low "0" logic level taken as ground to a high "1" logic $V_{dd}$. In the network B, the coupling capacitance is shown attached to network B between two cell instances, the first receiving a falling waveform 111 as input.

Figure 1:
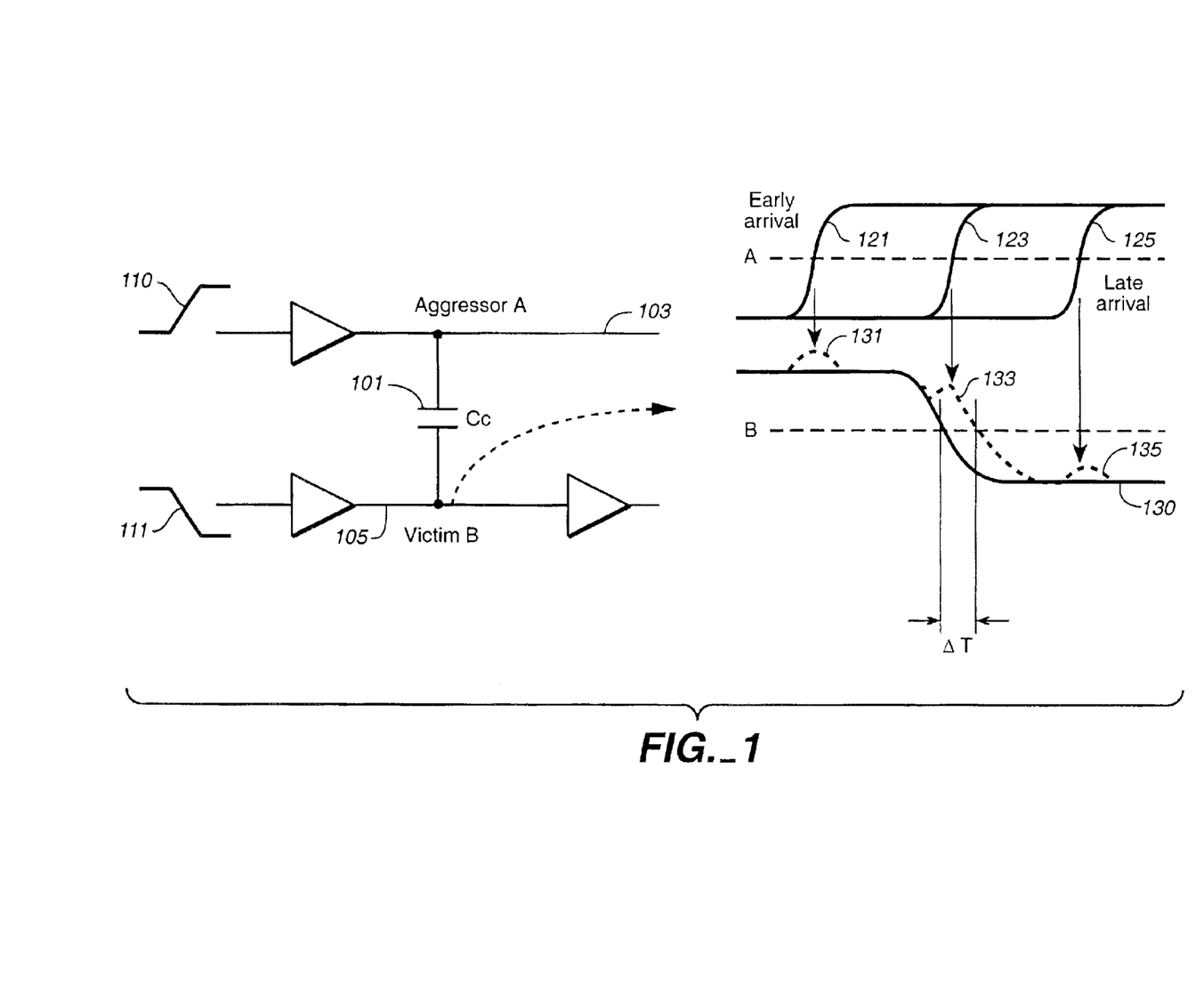
FIG. 1 illustrates an example of the effect of noise due to cross-talk coupling.

The impact on the victim network B 105 due to this cross-talk can include glitches and delay changes as shown in the right potion of FIG. 1. The output signal in network A that is capacitively coupled through $C_C$ 101 to network B is shown for three different timings of A's input 110 relative to B's input signal: early arrival 121, more or less coincidental arrival 123, and late arrival 125, with the output signal in network B shown as 130. The signal 130, shown as a solid line, represents the output signal in the absence of any cross-talk, with the effects of the noise represented by the broken lines 131, 133, and 135. The early arrival signal 121 and the late arrival signal 125 results in respective glitches 131 and 135. The more or less coincidental signal 123 shifts the falling waveform to 133 and is perceived as a delay of $\Delta T$. The delay 133 can affect circuit performance. The glitches can potentially cause greater problems: for example, if B is a digital portion of the circuit and glitch 135 is too large, this can be perceived by subsequent cells in network B as an incorrect logic state.

As a glitch propagates through a network it can damage the circuit in many ways. It may be magnified or reduced in the cells it passes through. It may also accumulate with other induced glitches. Eventually, the glitch height and width may be enough to toggle the inputs of storage cell and cause the output value to change. An example is shown in FIG. 2.

Figure 2:
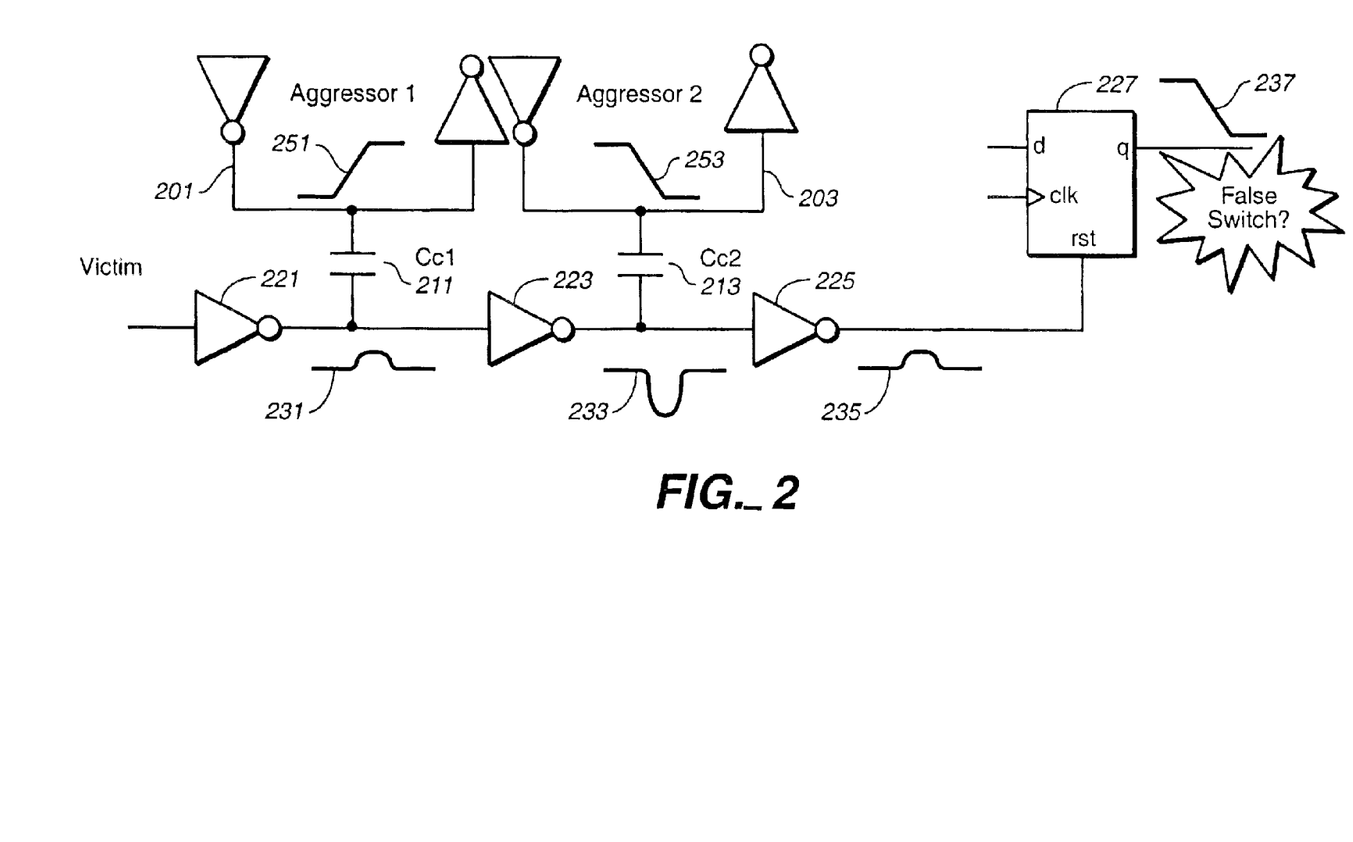
FIG. 2 is an example of how a glitch can affect a circuit.

In FIG. 2, the victim network is taken to consist of inverters 221, 223, and 225 in series connected to the reset of a flip-flop 227. Between inverters 221 and 223, the victim is capacitively coupled through a capacitance $C_{C1}$ 211 to a first aggressor network 201. It is also capacitively coupled through a capacitance $C_{C2}$ 213 to a second aggressor network 203 between inverters 223 and 225. A rising waveform in network 201 introduces glitch 231. The induced noise 231 propagates through inverter 223 where it is compounded with the result of a falling waveform in network 203 to produce the glitch 233, a result of both the newly induced noise combined with the propagated noise. The propagated noise from inverter 225 is shown as 235, which is connected to the reset input (rst) of inverter 227. If this noise is sufficient enough, it can cause the flip-flop 227 to output a false switch 237.

Figure 3:
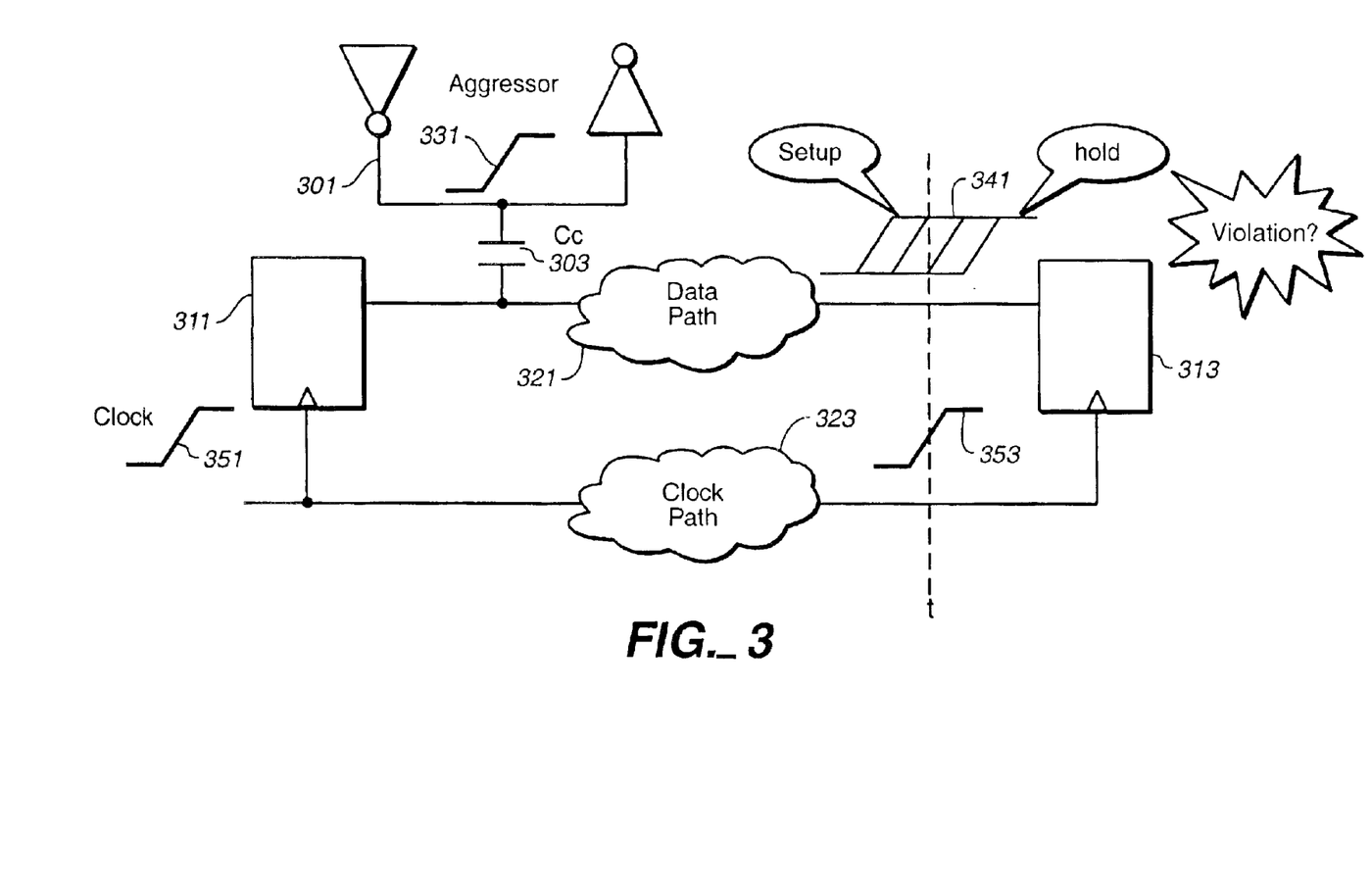
FIG. 3 is an example of how delay can affect a circuit.

An example of the effects of delay is illustrated in FIG. 3. The figure shows two instances of a flip-flop, 311 and 313, connected along a clock path 323 and a data path 321. A clock signal 351 is supplied to the reset input of flip-flop 311 and, through clock path 323, to the reset of input 313, where the propagated clock signal is shown as 353. The data path 321 is capacitively coupled through capacitance $C_C$ 303 to an aggressor network 301 so that a signal, such as waveform 331, in network 301 can induce noise in the data path. This can result in a delay or speed up for a waveform propagating through the data path 321, such as shown in 133 of FIG. 1. This can result in the propagated waveform 341 in the data path having a temporal offset relative to the propagated clock signal 353. The propagated data waveform 341 illustrates this by showing several rising waveforms either retarded or advanced with respect to the time t when the clock signal passes through $\frac{1}{2}V_{dd}$. Similarly, a delay or speed-up can occur in the clock path. These offsets can change the relative timing of clock or data signals when they arrive at cell 313 and possibly cause a violation. For example, a setup time violation can result from a worst data path delay (slow-down) combined with a best clock path delay (speed-up); conversely, a hold time violation can result from a best data path delay (speed-up) combined with a worst clock path delay (slowdown).

In the consideration of how such noise can affect circuit operation, and how it can be included in circuit simulations, a number of factors enter in and should be considered. These include how the noise is generated, how the noise propagates, and how it affects later circuit elements should all be considered. Various aspects of noise all dealt with in "Cell characterization for noise stability", K. L. Shepard and K. Chou, *IEEE* 2000 *Custom Integrated Circuits Conference*, and, more generally, in "Digital Integrated Circuits: a Design Perspective", Jan M. Rabaey, Prentice Hall, both of which are hereby incorporated by reference. More particularly, one prior art method of treating some aspects of noise, noise margins, is discussed in section 3.2 of the second of these references.

The use of DC/AC noise margin methods present an approach to consider peak noise on a cell level by looking at the allowable noise level that can occur between the signal leaving the output of one stage and arriving at the input of the subsequent cell. Briefly, the voltage in a circuit will typically fall in a range ground to $V_{dd}$. A well-defined digital state "0" will lie between 0V (or, more generally, $V_{ss}$) and a value $V_L$ and a well-defined digital state "1" Will lie between a value $V_H$ and $V_{dd}$, with the range of $V_L$ to $V_H$ being an unstable x region. If the additional subscript O corresponds to the output of one stage and the subscript I corresponds to the input of the subsequent cell, noise margins $M_H$ and $M_L$, $$M_L = V_{IL} - V_{OL}$$

$$M_H = V_{OH} - V_{IH},$$

represent the maximum amount of noise that can safely accumulate between cells.

Although this provides one simple way to consider the effects of noise, it only looks at peak noise value. In many cases, this is too simple an approach to noise and circuit designers could use improvement techniques.

SUMMARY OF THE INVENTION

The present invention presents techniques for considering whether the effects of cross-talk coupling and other noise exceed the noise tolerance of a circuit. One aspect of the present invention uses a set of parameters to represent this noise. An exemplary embodiment uses a triangle or trapezoidal approximation to a glitch based on a set of parameters: the peak voltage value, the width, the leading edge slope and the trailing edge slope. These values are then used as the input of a library to look up the corresponding noise tolerance parameter set values. In a variation, a set of formulae can provide the noise tolerance parameter set values. In an exemplary embodiment, the noise tolerance parameter set is taken to include the minimum peak value for the noise to be possibly harmful and the minimum width value for the noise to be possibly harmful.

Additional aspects, features and advantages of the present invention are included in the following description of exemplary embodiments, which description should be read in conjunction with the accompanying drawings.

DESCRIPTION OF EXEMPLARY EMBODIMENTS OF THE INVENTION

The prior art has a number of problems that lead to inaccuracies in the treatment of noise propagation and its effect on subsequent cells. To more accurately simulate noise in a circuit, the glitch is considered more accurately and not just in terms of peak values. One aspect of the present invention considers the noise waveform in more detail, including not only its amplitude or peak value (Vp), but also its shape, including details such as its width (W) and slope (slew rates for rising and falling edges). Two different glitches with the same peak value Vp can affect a subsequent cell quite differently. For example, in FIG. 2 a very narrow glitch at the rst input may not result in a false switch whereas a wider glitch of the same peak value may. For some cells, differing rise or fall times will affect the cell differently.

Traditionally, the analysis of digital circuits would not worry about width and other glitch characteristics as these are more of an analog concern.

Figure 4:
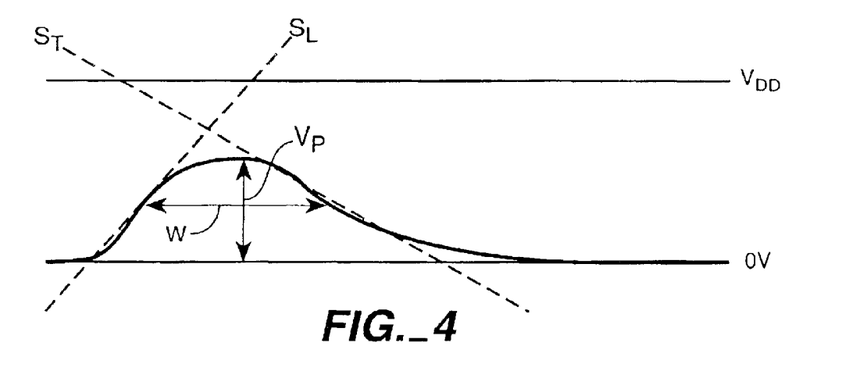
FIG. 4 shows a generic glitch and some associated parameters.

A generic glitch is shown in FIG. 4, where the baseline (noiseless) signal upon which the noise is added is taken as $V_{ss}$ or 0V to simplify the discussion. The glitch has a maximum amplitude Vp, a width W, a leading edge slope $S_L$, and a trailing edge slope $S_T$. The width and slopes can be defined in many ways, depending where on the glitch they are taken. Thus, there are many ways to parameterize a glitch using different numbers of parameters, the simplest beyond just the peak value being the inclusion of a width. For example, the glitch could be modeled on a gaussian distribution having a height Vp and width W, with any deviations from a gaussian based on the higher moments of the distribution. Alternately, W could be defined as the width at $\frac{1}{2}V_{dd}$, $\frac{1}{2}$Vp or other fraction of distance between the high and low voltage values.

Figure 5A:
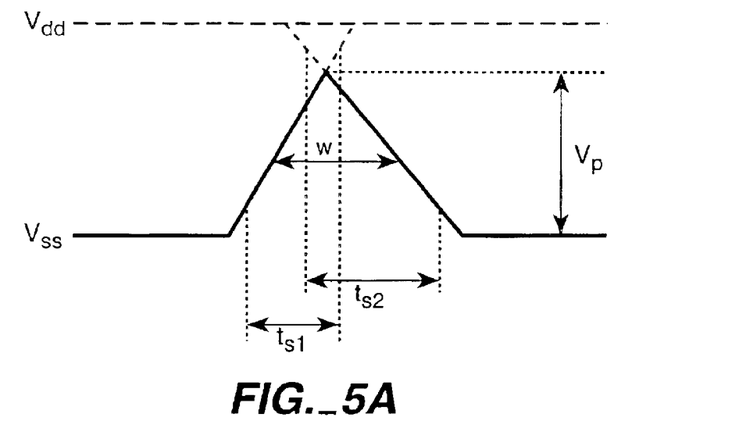
FIGS. 5a and 5b show examples of waveform approximations and the parameters used in exemplary embodiments.
Figure 5B:
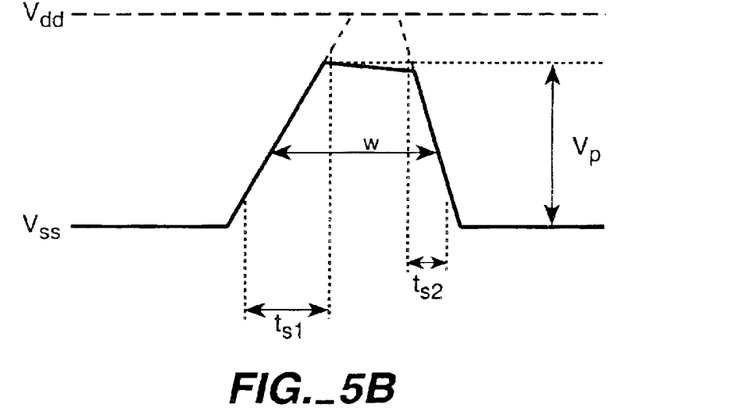

An exemplary embodiment of the noise waveform method uses a unified triangle and trapezoid waveform approximation for the noise, as shown in FIGS. 5a and 5b. The system voltage is taken to range between a low value of $V_{ss}$ and a high value of $V_{dd}$, with the noise waveform parameters describing these approximations as Vp, W, $t_{s1}$, and $t_{s2}$. The width of the waveform is given by W and the leading and trailing edge slopes by $t_{s1}$ and $t_{s2}$, respectively. The set of incident noise parameters (Vp, W, $t_{s1}$, $t_{s2}$) represent the glitch as it arrives at a given instance of a cell. (For the triangular approximation, these parameters are not independent; for instance, W can be determined from Vp, $t_{s1}$, and ts2 if W is not already explicitly part of the incident noise parameter set.) Alternate parameterizations of the triangle and trapezoid, for example based on angles, can be used, as can other definitions of Vp, W, $t_{s1}$, and $t_{s2}$. Other approximation schemes can be based on other shapes.

In the exemplary parameterizations of FIGS. 5a and 5b, the amplitude Vp is defined as the height of the glitch above a baseline of $V_{ss}$ and W is defined as the width from $0.5V_{dd}$ on the leading edge to $0.5V_{dd}$ on the trailing edge. The trapezoidal approximation uses a flat top, although in the more general case a sloping top could be used. For $t_{s1}$ and $t_{s2}$, the definition is taken to be consistent with that in timing library. Generally, these are defined as 0.1Vdd to 0.9Vdd for a rising edge and 0.9Vdd to 0.1Vdd for a falling edge.

Various methods for simulating integrated circuit operation and how the cells within them respond to a particular input, such as that of the triangle approximation given by parameters set (Vp, $t_{s1}$, $t_{s2}$), are described in the following U.S. patent applications, all of which are hereby incorporated by reference: Ser. No. 09/661,328, filed Sep. 14, 2000, and entitled "MOSFET Modeling for IC Design Accurate for High Frequencies"; Ser. No. 09/832,933, filed Apr. 11, 2001, and entitled "Hot-Carrier Circuit Reliability Simulation"; Ser. No. 09/969,186, filed Sep. 27, 2001, and entitled "Hot-Carrier Reliability Design Rule Checker"; and Ser. No. 09/969,185, filed Sep. 27, 2001, and entitled "Hot-Carrier Device Degradation Modeling And Extraction Methodologies".

The present invention looks at the noise tolerance of an integrated circuit by considering how the noise will affect the cell instances of the circuit. The noise arriving at a cell is characterized by a set of parameters, such as the exemplary (Vp, W, $t_{s1}$, $t_{s2}$), a peak voltage and a suitable defined width, or another characterization including information related to the shape of the incident noise. Using this characterization, the response of different elements to this stimulus is determined by a SPICE simulation or other techniques.

In another aspect of the present invention, a set of noise tolerance parameters is associated with a given cell of the circuit. This set of noise tolerance parameters can then be compared against the set of incident noise parameters. In an exemplary embodiment, the noise tolerance parameters are defined as:

$V_{peak}$: the minimum peak value for the noise to be possibly harmful, and $W_{min}$: the minimum width value for the noise to be possibly harmful.

These two parameters are generally the most relevant parameters within a cell to determine its noise tolerance. More generally, other relevant parameters can also be included in the tolerance parameter set, as is discussed further below. For example, if the slew rate for the rising or falling edge of the noise waveform is particularly relevant for a given cell, a $t_{s1max}$ or $t_{s2max}$ value could be included.

As in the concurrently filed patent application entitled "Shape Based Noise Characterization and Analysis of LSI", incorporated by reference above, the present invention also employs a library. As described therein, for practicality, there are several library considerations. Generally, the maximum number of desirable dimensions of tables in noise library is three dimensions.

More specifically, for the exemplary embodiment where the noise tolerance parameter set is taken as ($V_{peak}$, $W_{min}$), $V_{peak}$ is characterized by finding the minimum peak value such that the output is still kept at its original digital value; that is, it is the largest noise amplitude for which a "1" state stays a "1" state and a "0" state stays a "0". For pins in combinational or sequential cells, the condition for characterization is set to make the noise waveform width be wide enough to get the worst-case result. The transition times ($t_{s1}$, $t_{s2}$) and the load capacitance ($C_{load}$) do not affect the output and $V_{peak}$ is a constant for the pin of a cell. For some pins in sequential cells, the transition time of clock ($T_{clk}$) pin will affect $V_{peak}$.

$W_{min}$ is characterized by finding the minimum width value so that the output is still kept at its original digital value. In order to find the worst case $W_{min}$, the noise peak value is taken as VDD or VSS, depending on whether the value without noise is a logical low value or logical high value. The transition times ($t_{s1}$, $t_{s2}$) and the load capacitance ($C_{load}$) or transition time of clock pin ($T_{clk}$) may affect the output. In a more complex implementation, $W_{min}$ could also include dependence on Vp and the other input parameters.

The library usage for noise tolerance checking in the exemplary embodiment is taken to include receiving the input parameters Vp, $t_{s1}$, $t_{s2}$, W, $C_{load}$, and/or $T_{clk}$. In a first step, according to input parameters, the library is used to perform a table lookup for $V_{peak}$. In a variation, a set of formulae can provide the noise tolerance parameter set values instead of, or combined with, a lookup table. If $V_p < V_{peak}$, the noise does not affect the logic function. If $V_p > V_{peak}$, the exemplary embodiment proceeds to a second step. Again, according to input parameters, a table lookup is performed for $W_{min}$. If $W < W_{min}$, the noise does not affect the logic function; otherwise, the noise may effect the logic function. More generally, if additional elements form part of the noise tolerance parameter set, they may be added to this flow.

Figure 6:
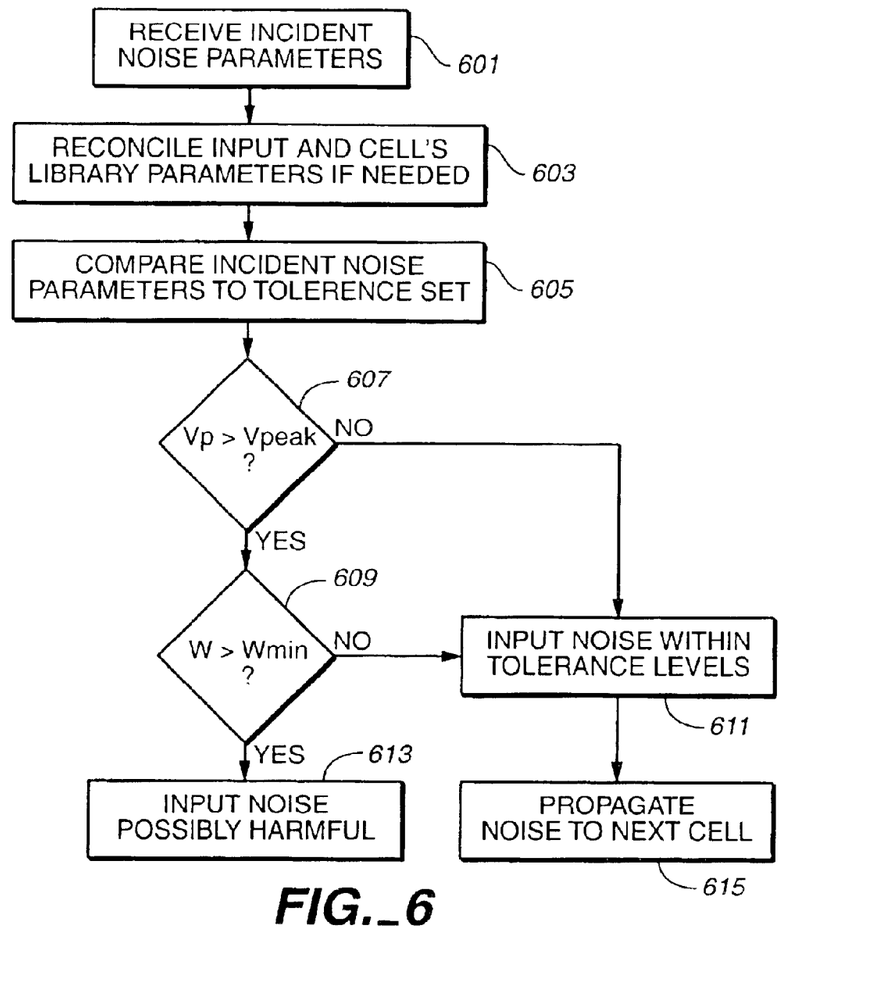
FIG. 6 is a flow chart of an exemplary embodiment for the characterization of noise tolerance.

FIG. 6 is an exemplary flow chart of the process for a given cell. The process begins in step 601 with receiving the set of input parameters, including information on the shape of the noise waveform. In the exemplary embodiment, this can include such things as a width for the waveform along with its leading and trailing edge slopes in the triangular or trapezoidal approximation. If the incident waveform data were not yet parameterized, this would also be performed at this step. Other elements of the input parameter set can also include the amplitude of the noise, Vp, as well as parameters related to the cell itself, such as $C_{load}$ or $T_{clk}$. Alternately, these cell related may be associated with a cell's entry in the library or input from another source separate from the set of incident noise parameters. For a particular cell, the noise data may be put in directly by the user or may be the propagated noise from a preceding cell as described in concurrently filed U.S. patent application entitled "Shape Based Noise Characterization and Analysis of LSI" that was incorporated by reference above.

Step 603 is an optional step included if the elements of the input parameter set needs to be reconciled with the tolerance parameter set. If the noise tolerance parameter set differs from incident parameter set, one of the parameter sets will be converted: for example, if the incident noise is expressed as a triangular waveform in terms of (Vp, $t_{s1}$, $t_{s2}$) while noise tolerance entries in the library for the cell are expressed in terms of W, W can be extracted at this point. Additionally, it may be that that the same parameter is in both sets, but defined somewhat differently (W at ½Vp versus W at ½$V_{dd}$) and require conversion. As noted above, the tolerance parameters associated with a given cell may vary depending on the cell, so the details of how to convert the input parameters may change from one cell to the next as the noise propagates through the circuit.

In step 605, the (possibly reconciled) parameter sets are compared to determine if the noise level may be harmful. Although the exemplary embodiment is based on the worst case for the noise tolerance parameter set ($V_{peak}$, $W_{min}$), where the criterion for both of these parameters must be meet, more generally there will different elements and different relations that may also vary from cell to cell. The noise tolerance parameter set may be fixed, user selected, or determined by the library entry (or functional relations) for the particular cell. For example, in addition to amplitude and shape information the input parameter set could include $C_{load}$, or $T_{clk}$, but in cells for which these are not as important they may not be used in the tolerance criteria.

Steps 607 and 609 are a particular implementation of step 605, specifically the exemplary embodiment. The values of the cell's ($V_{peak}$, $W_{min}$) values from the library are compared against Vp and W from the input parameter set, other elements being ignored. In step 607, if Vp does not exceed $V_{peak}$ the input noise is acceptable and the process goes to step 611. If instead Vp exceeds the acceptable level, the process goes to step 609 and W is compared to $W_{min}$. If this test is also failed by W exceeding $W_{min}$, it is determined that the noise level could be harmful, while if W is less than the bound, the noise level is acceptable and again goes to step 611.

In this exemplary embodiment, the selected noise parameters need to exceed both bounds: any width is acceptable if Vp small enough and any Vp acceptable if narrow enough. Even when restricted to just these two variables, a number of variations are possible: the order of steps 607 and 609 could be reversed, the flow could lead to step 613 if either of 607 or 609 failed, or the acceptable level of one could depend on the level of the other in a functional relation. The variations also increase as the number of elements in the noise tolerance parameter set increases.

More generally, other characterizations of the noise waveform's shape can enter in, along with characteristics such as $C_{load}$, or $T_{clk}$, depending on the particular cell. If for example the rise or fall rate of the noise waveform are important for a given cell, $t_{s1}$ or $t_{s2}$ can be checked. In addition to a straight look-up table approach, a set of formulae can provide the noise tolerance parameter set values, say where $W_{min}=W_{min}(T_{clk})$ and the tolerance criterion for W could be that $W<W_{min}(T_{clk})$ for the input value of $T_{clk}$.

For whatever the particular implementation, after the tolerance criteria are checked, the process leads to either step 611 or step 613. If the incident noise falls within acceptable levels, leading to step 611, the process can continue on to any subsequent cells. The propagated noise can be determined as in the patent application entitled "Shape Based for Noise Characterization and Analysis of LSI", incorporated by reference above, and the process of FIG. 6 repeated in this subsequent cell. If the tolerance criteria fail (step 613), this can be reported out to the user along with the details. Step 613 can also be followed by step 615 if it is desired to see how the particular noise waveform propagates despite being possibly harmful in the present cell. In either case, the results can be employed by the user to alter tolerances if desired or otherwise study the circuit's behavior.

It is well known in the art that logic or digital systems and/or methods can include a wide variety of different components and different functions in a modular fashion. The following will be apparent to those of skill in the art from the teachings provided herein. Different embodiments of the present invention can include different combinations of elements and/or functions. Different embodiments of the present invention can include actions or steps performed in a different order than described in any specific example herein. Different embodiments of the present invention can include groupings of parts or components into larger parts or components different than described in any specific example herein. For purposes of clarity, the invention is described in terms of systems that include many different innovative components and innovative combinations of innovative components and known components. No inference should be taken to limit the invention to combinations containing all of the innovative components listed in any illustrative embodiment in this specification. The functional aspects of the invention, as will be understood from the teachings herein, may be implemented or accomplished using any appropriate implementation environment or programming language, such as C++, Java, JavaScript, etc.

The present invention is presented largely in terms of procedures, steps, logic blocks, processing, and other symbolic representations that resemble data processing devices. These process descriptions and representations are the means used by those experienced or skilled in the art to most effectively convey the substance of their work to others skilled in the art. The method along with the system to be described in detail below is a self-consistent sequence of processes or steps leading to a desired result. These steps or processes are those requiring physical manipulations of physical quantities. Usually, though not necessarily, these quantities may take the form of electrical signals capable of being stored, transferred, combined, compared, displayed and otherwise manipulated in a computer system or electronic computing devices. It proves convenient at times, principally for reasons of common usage, to refer to these signals as bits, values, elements, symbols, operations, messages, terms, numbers, or the like. It should be borne in mind that all of these similar terms are to be associated with the appropriate physical quantities and are merely convenient labels applied to these quantities. Unless specifically stated otherwise as apparent from the following description, it is appreciated that throughout the present invention, discussions utilizing terms such as processing or computing or verifying or displaying or the like, refer to the actions and processes of a computing device that manipulates and transforms data represented as physical quantities within the device's registers and memories into analog output signals via resident transducers.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a users computer or a fixed media program can reside on a remote server that a user accesses through a communication medium in order to download a program component. Examples of such fixed media include a disk-type optical or magnetic media, magnetic tape, solid-state memory, etc. The invention may be embodied in whole or in part as software recorded on this fixed media.

The invention also may be embodied in whole or in part within the circuitry of an application specific integrated circuit (ASIC) or a programmable logic device (PLD). In such a case, the invention may be embodied in a computer understandable descriptor language that may be used to create an ASIC or PLD that operates as herein described.

Although the invention has been described with respect to various exemplary embodiments, it will be understood that the invention is entitled to protection within the full scope of the appended claims.

What is claimed is:

1. A method of determining noise tolerance in an integrated circuit, comprising:

receiving a set of input parameters including a characterization of a noise waveform incident on a cell of said integrated circuit, wherein said characterization comprises information on the shape of the incident noise waveform;

providing a set of one or more noise tolerance criteria, wherein said criteria include a shape related condition; and determining whether said set of input parameters violate the noise tolerance criteria.

2. The method of claim 1, wherein said determining comprises using said set of input parameters in a set of formulae to determine whether said set of input parameters violate the noise tolerance criteria.

3. The method of claim 1, wherein said determining comprises using a library of look-up tables.

4. The method of claim 1, wherein said characterization further includes an amplitude parameter for said incident noise waveform.

5. The method of claim 4, wherein said shape information includes a set of one or more shape parameters describing said incident noise waveform.

6. The method of claim 5, wherein said one or more shape parameters includes a width parameter for said incident noise waveform.

7. The method of claim 5, wherein said incident noise waveform is approximated by a triangular waveform.

8. The method of claim 7, wherein said one or more shape parameters includes the leading edge slope and trailing edge slope of the triangle waveform.

9. The method of claim 1, further comprising:
determining said set of input parameters from data on the incident noise waveform.

10. The method of claim 1, wherein said set of input parameters includes a load capacitance.

11. The method of claim 1, wherein said set of input parameters includes a transition time of a clock pin.

12. A method of determining noise tolerance in an integrated circuit, comprising:
receiving a set of input parameters including a characterization of a noise waveform incident on a cell of said integrated circuit, wherein said characterization comprises information on the shape of the incident noise waveform;
providing a set of one or more noise tolerance criteria, wherein said criteria include a shape related condition;
determining whether said set of input parameters violate the noise tolerance criteria, wherein said determining comprises using a library of look-up tables, and wherein said set of input parameters comprises an amplitude parameter and one or more shape parameters and wherein said noise tolerance criteria comprise a parameter set including one or more shape related condition parameters; and
reconciling the input parameter set with the noise tolerance criteria parameter set prior to said determining.

13. The method of claim 12, wherein said noise tolerance criteria parameter set includes a width criterion and wherein said reconciling comprises:
extracting a width parameter from said the shape parameters of the input parameter set.

14. A method of determining noise tolerance in an integrated circuit, comprising:
receiving a set of input parameters including a characterization of a noise waveform incident on a cell of said integrated circuit, wherein said characterization comprises information on the shape of the incident noise waveform and further includes an amplitude parameter for said incident noise waveform, wherein said shape information includes a set of one or more shape parameters describing said incident noise waveform;
providing a set of one or more noise tolerance criteria, wherein said criteria include a shape related condition; and
determining whether said set of input parameters violate the noise tolerance criteria, wherein said incident noise waveform is approximated by a trapezoidal waveform.

15. The method of claim 14, wherein said one or more shape parameters includes a width parameter, the leading edge slope and trailing edge slope of the trapezoidal waveform.

16. A method of determining noise tolerance in an integrated circuit, comprising:
receiving a set of input parameters including a characterization of a noise waveform incident on a cell of said integrated circuit, wherein said characterization comprises information on the shape of the incident noise waveform and further includes an amplitude parameter for said incident noise waveform, wherein said shape information includes a set of one or more shape parameters describing said incident noise waveform;
providing a set of one or more noise tolerance criteria, wherein said criteria include a share related condition; and
determining whether said set of input parameters violate the noise tolerance criteria, wherein said noise tolerance criteria comprise a parameter set including an amplitude criterion and a width criterion and wherein the shape parameters include a width parameter, wherein said determining comprises:
determining whether said amplitude parameter exceeds the amplitude criterion; and
subsequently determining whether said width parameter exceeds the width criterion.

17. A computer readable storage device embodying a program of instructions executable by a computer to perform a method of determining noise tolerance in an integrated circuit, said method comprising:
receiving a set of input parameters including a characterization of a noise waveform incident on a cell of said integrated circuit, wherein said characterization comprises information on the shape of the incident noise waveform;
providing a set of one or more noise tolerance criteria, wherein said criteria include a shape related condition; and
determining whether said set of input parameters violate the noise tolerance criteria.

18. The computer readable storage device of claim 17, wherein said determining comprises using said set of input parameters in a set of formulae to determine whether said set of input parameters violate the noise tolerance criteria.

19. The computer readable storage device of claim 17, wherein said determining comprises using a library of look-up tables.

20. The computer readable storage device of claim 19, wherein said set of input parameters comprises an amplitude parameter and one or more shape parameters and wherein said noise tolerance criteria comprise a parameter set including one or more shape related condition parameters, the method further comprising:
reconciling the input parameter set with the noise tolerance criteria parameter set prior to said determining.

21. The computer readable storage device of claim 20, wherein said noise tolerance criteria parameter set includes a width criterion and wherein said reconciling comprises:
extracting a width parameter from said the shape parameters of the input parameter set.

22. The computer readable storage device of claim 17, wherein said characterization further includes an amplitude parameter for said incident noise waveform.

23. The computer readable storage device of claim 22, wherein said shape information includes a set of one or more shape parameters describing said incident noise waveform.

24. The computer readable storage device of claim 23, wherein said one or more shape parameters includes a width parameter for said incident noise waveform.

25. The computer readable storage device of claim 23, wherein said incident noise waveform is approximated by a triangular waveform.

26. The computer readable storage device of claim 25, wherein said one or more shape parameters includes the leading edge slope and trailing edge slope of the triangle waveform.

27. The computer readable storage device of claim 23, wherein said incident noise waveform is approximated by a trapezoidal waveform.

28. The computer readable storage device of claim 27, wherein said one or more shape parameters includes a width parameter, the leading edge slope and trailing edge slope of the trapezoidal waveform.

29. The computer readable storage device of claim 23, wherein said noise tolerance criteria comprise a parameter set including an amplitude criterion and a width criterion and wherein the shape parameters include a width parameter, wherein said determining comprises:

determining whether said amplitude parameter exceeds the amplitude criterion; and subsequently determining whether said width parameter exceeds the width criterion.

30. The computer readable storage device of claim 17, further comprising:

determining said set of input parameters from data on the incident noise waveform.

31. The computer readable storage device of claim 17, wherein said set of input parameters includes a load capacitance.

32. The computer readable storage device of claim 17, wherein said set of input parameters includes a transition time of a clock pin.

33. A method for transmitting a program of instructions executable by a computer to perform a process of determining noise tolerance in an integrated circuit, said process comprising:

receiving a set of input parameters including a characterization of a noise waveform incident on a cell of said integrated circuit, wherein said characterization comprises information on the shape of the incident noise waveform;

providing a set of one or more noise tolerance criteria, wherein said criteria include a shape related condition; and determining whether said set of input parameters violate the noise tolerance criteria.

34. The method of claim 33, wherein said determining comprises using said set of input parameters in a set of formulae to determine whether said set of input parameters violate the noise tolerance criteria.

35. The method of claim 33, wherein said determining comprises using a library of look-up tables.

36. The method of claim 35, wherein said set of input parameters comprises an amplitude parameter and one or more shape parameters and wherein said noise tolerance criteria comprise a parameter set including one or more shape related condition parameters, the process further comprising:

reconciling the input parameter set with the noise tolerance criteria parameter set prior to said determining.

37. The method of claim 36, wherein said noise tolerance criteria parameter set includes a width criterion and wherein said reconciling comprises:

extracting a width parameter from said the shape parameters of the input parameter set.

38. The method of claim 33, wherein said characterization further includes an amplitude parameter for said incident noise waveform.

39. The method of claim 38, wherein said shape information includes a set of one or more shape parameters describing said incident noise waveform.

40. The method of claim 39, wherein said one or more shape parameters includes a width parameter for said incident noise waveform.

41. The method of claim 39, wherein said incident noise waveform is approximated by a triangular waveform.

42. The method of claim 41, wherein said one or more shape parameters includes the leading edge slope and trailing edge slope of the triangle waveform.

43. The method of claim 39, wherein said incident noise waveform is approximated by a trapezoidal waveform.

44. The method of claim 43, wherein said one or more shape parameters includes a width parameter, the leading edge slope and trailing edge slope of the trapezoidal waveform.

45. The method of claim 39, wherein said noise tolerance criteria comprise a parameter set including an amplitude criterion and a width criterion and wherein the shape parameters include a width parameter, wherein said determining comprises:

determining whether said amplitude parameter exceeds the amplitude criterion; and subsequently determining whether said width parameter exceeds the width criterion.

46. The method of claim 33, further comprising:

determining said set of input parameters from data on the incident noise waveform.

47. The method of claim 33, wherein said set of input parameters includes a load capacitance.

48. The method of claim 33, wherein said set of input parameters includes a transition time of a clock pin.

* * * * *